(12) United States Patent
Chien et al.

(10) Patent No.: US 11,601,100 B2
(45) Date of Patent: Mar. 7, 2023

(54) RADIO FREQUENCY CIRCUIT

(71) Applicant: RichWave Technology Corp., Taipei (TW)

(72) Inventors: Hwey-Ching Chien, Taipei (TW); Chih-Sheng Chen, Taipei (TW); Jhao-Yi Lin, Taipei (TW); Ching-Wen Hsu, Taipei (TW)

(73) Assignee: RichWave Technology Corp., Taipei (TW)

( * ) Notice: Subject to any disclaimer, the term of this patent is extended or adjusted under 35 U.S.C. 154(b) by 333 days.

(21) Appl. No.: 16/945,916

(22) Filed: Aug. 2, 2020

(65) Prior Publication Data

US 2021/0091727 A1 Mar. 25, 2021

(30) Foreign Application Priority Data

Sep. 20, 2019 (TW) ................................. 108133916

(51) Int. Cl.
*H03F 1/56* (2006.01)
*H03L 7/089* (2006.01)

(52) U.S. Cl.
CPC ............... *H03F 1/56* (2013.01); *H03L 7/089* (2013.01); *H03F 2200/451* (2013.01)

(58) Field of Classification Search
CPC .. H03K 5/00006; H03K 5/06; H03K 19/0005; H03K 21/02; H03K 21/08; H03K 21/40; H03F 1/56; H03F 1/565; H03F 2200/451; H03L 7/085; H03L 7/089; H03L 7/091; G01R 23/005; G01R 23/02

See application file for complete search history.

(56) References Cited

U.S. PATENT DOCUMENTS 6,333,677 B1 * 12/2001 Dening .................... H03F 3/19
330/296
2011/0037453 A1 2/2011 Hulsmann
2018/0175730 A1 6/2018 Leong

FOREIGN PATENT DOCUMENTS

| CN | 203180933 U | 9/2013 |
| CN | 104198891 A | 12/2014 |
| CN | 108206628 A | 6/2018 |
| WO | 2007/081348 A2 | 7/2007 |

* cited by examiner

*Primary Examiner* — Long Nguyen
(74) *Attorney, Agent, or Firm* — Winston Hsu (57) ABSTRACT

The frequency detector includes a first impedance circuit and a second impedance circuit. The first impedance circuit has a first terminal for receiving an input signal, and a second terminal for outputting a divisional signal. The second impedance circuit has a first terminal coupled to the second terminal of the first impedance circuit, and a second terminal coupled to a first system voltage terminal. The frequency response of the first impedance circuit is different from a frequency response of the second impedance circuit. The resistance of the first impedance circuit, a resistance of the second impedance circuit, and the divisional signal change with a frequency of the input signal.

17 Claims, 7 Drawing Sheets

RADIO FREQUENCY CIRCUIT

CROSS REFERENCE TO RELATED APPLICATION

This application claims priority of Taiwan application No. 108133916, which was filed on Sep. 20, 2019, and is included herein by reference.

TECHNICAL FIELD

The present invention is related to a radio frequency circuit, and more particularly, to a radio frequency circuit having a frequency detector.

BACKGROUND

As the development of network communication applications becomes more and more diverse, electronic devices are required to support wider frequency bands for different applications. In existing arts, some electronic devices may support more than two different frequency bands at the same time. For example, the electronic devices supporting applications of the wireless networks may support both the 2.4 GHz band and the 5 GHz band.

However, since electronic components inside the electronic device have different frequency responses at different frequencies, it is difficult to maintain the same signal quality in all frequency bands even if the electronic device is designed to support a wider bandwidth. For example, when an electronic device amplifies an input signal via an amplifying circuit, since the frequency response of each component in the amplifying circuit is different, the linearity of the amplifying circuit would be poor for signals within some bands, resulting in signal distortion and decline in quality of communications.

SUMMARY

One embodiment of the present invention discloses a frequency detector. The frequency detector includes a first impedance circuit and a second impedance circuit.

The first impedance circuit has a first terminal configured to receive an input signal, and a second terminal for outputting a divisional signal. The second impedance circuit has a first terminal coupled to the second terminal of the first impedance circuit, and a second terminal coupled to a first system voltage terminal.

The frequency response of the first impedance circuit is different from a frequency response of the second impedance circuit. A resistance of the first impedance circuit, a resistance of the second impedance circuit, and the divisional signal change with a frequency of the input signal.

Another embodiment of the present invention discloses a radio frequency circuit. The radio frequency circuit includes a frequency detector and a signal processing unit.

The frequency detector includes a first impedance circuit and a second impedance circuit. The first impedance circuit has a first terminal for receiving an input signal, and a second terminal for outputting a divisional signal. The frequency detector outputs a detection signal according to the divisional signal. The second impedance circuit has a first terminal coupled to the second terminal of the first impedance circuit, and a second terminal coupled to a first system voltage terminal.

The signal processing unit processes the input signal, and adjusts a frequency response of the signal processing unit according to the detection signal.

The frequency response of the first impedance circuit is different from a frequency response of the second impedance circuit. A resistance of the first impedance circuit, a resistance of the second impedance circuit, and the divisional signal change with a frequency of the input signal.

DETAILED DESCRIPTION

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Figure 1:
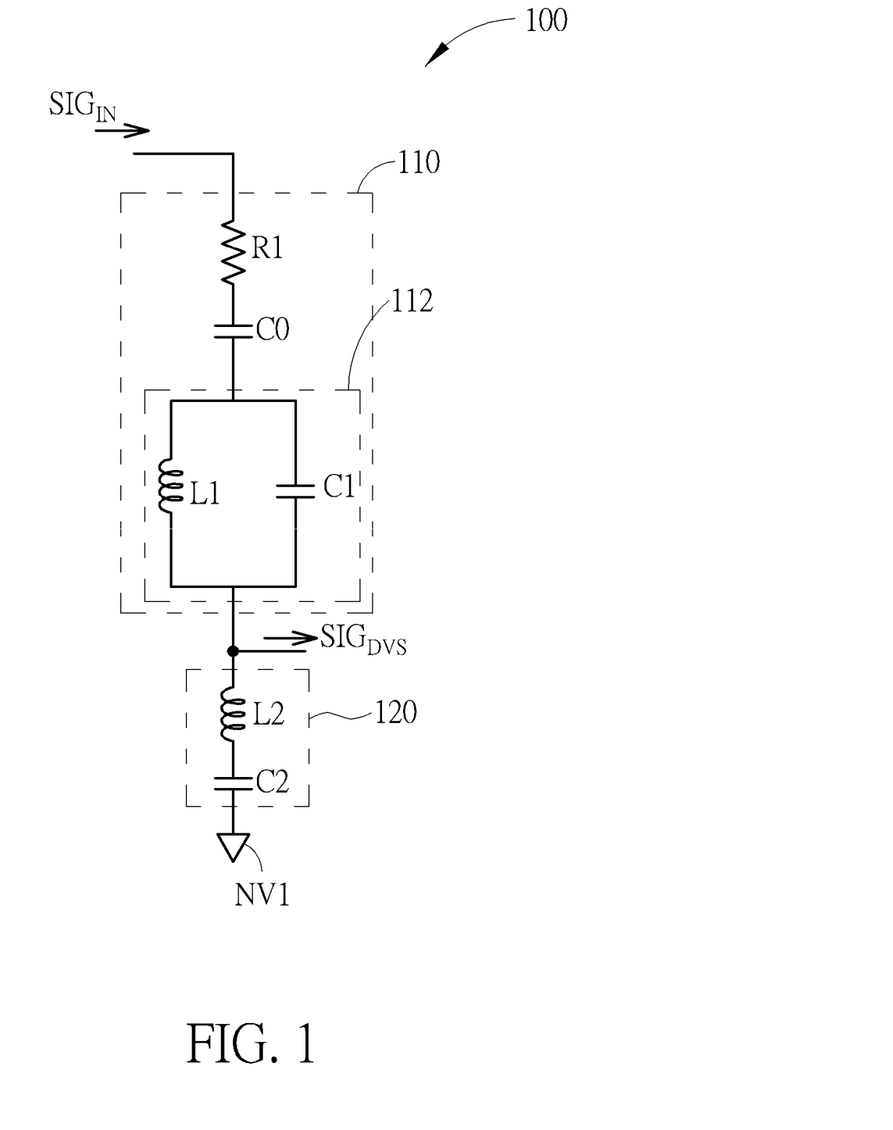
FIG. 1 shows a frequency detector according to one embodiment of the present invention.

FIG. 1 shows a frequency detector 100 according to one embodiment of the present invention. The frequency detector 100 includes a first impedance circuit 110 and a second impedance circuit 120.

The first impedance circuit 110 has a first terminal for receiving an input signal $SIG_{IN}$, such as a radio frequency (RF) signal, and a second terminal for outputting a divisional signal $SIG_{DVS}$. The second impedance 120 has a first terminal coupled to the second terminal of the first impedance circuit 110, and a second terminal coupled to a first system voltage terminal NV1.

In some embodiments, the frequency response of the first impedance circuit 110 could be different from the frequency response of the second impedance circuit 120. That is, when the frequency of the input signal $SIG_{IN}$ changes, the resistance of the first impedance circuit 110 and the resistance of the second impedance circuit 120 will also change accordingly, resulting in the change of voltage of the divisional signal $SIG_{DVS}$. Namely, the voltage variation of the divisional signal $SIG_{DVS}$ is related to the frequency of the input signal $SIG_{IN}$, so the frequency detector 100 could detect the frequency of the input signal $SIG_{IN}$ with the divisional signal $SIG_{DVS}$.

In some embodiments, within a testing frequency band of the frequency detector 100, if the change of impedance with respect to frequency of the first impedance circuit 110 and the change of impedance with respect to frequency of the second impedance circuit 120 have opposite tendencies, the tendency of change of the divisional signal $SIG_{DVS}$ could be ensured to be positively correlated to the change of the frequency of the input signal $SIG_{IN}$. That is, within the testing frequency band, when the frequency of the input signal $SIG_{IN}$ is higher, the voltage of the divisional signal $SIG_{DVS}$ will be higher or lower accordingly, so that the frequency of the input signal $SIG_{IN}$ can be determined more clearly.

Figure 2:
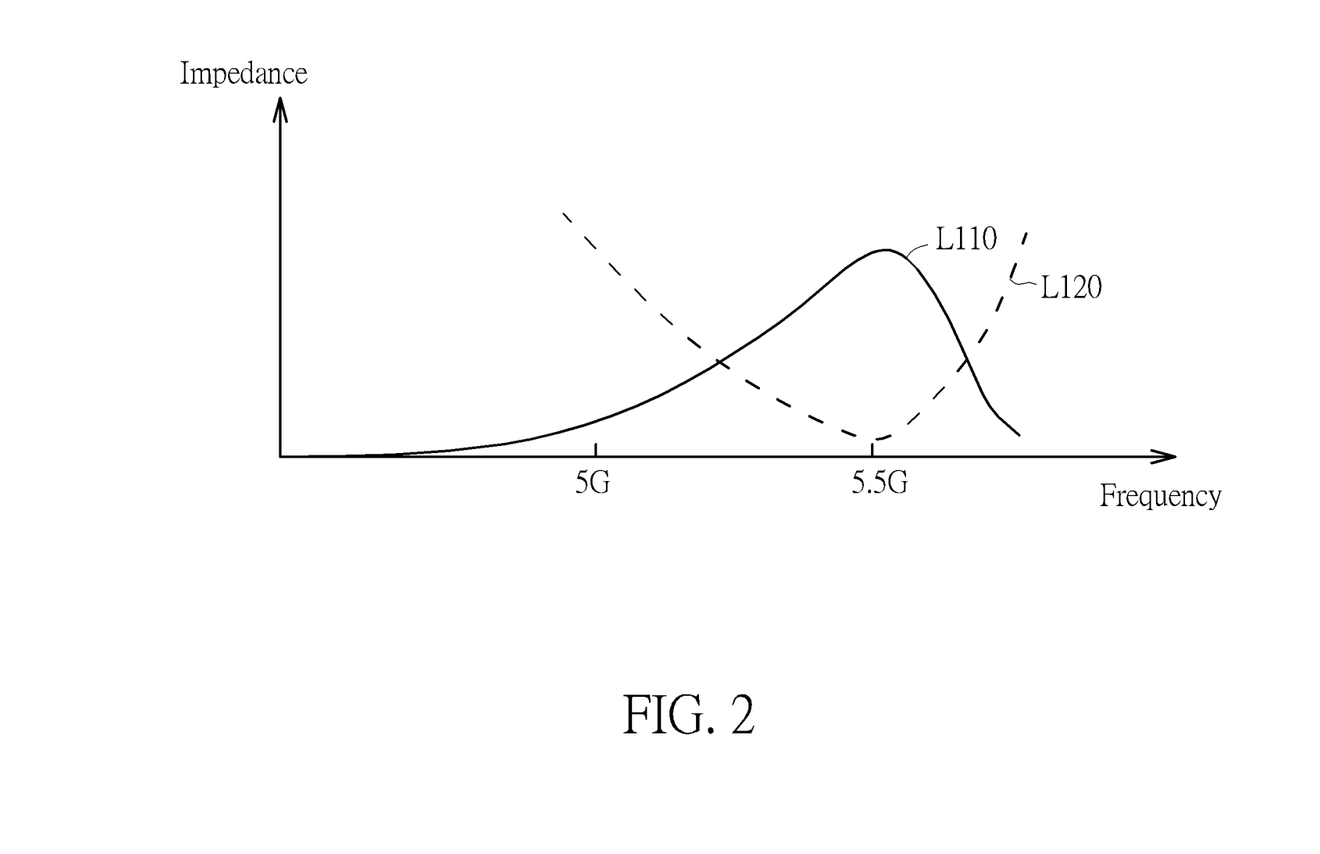
FIG. 2 shows the frequency responses of the first impedance circuit and the second impedance circuit of the frequency detector in FIG. 1.

FIG. 2 shows the frequency response of the first impedance circuit 110 and of the second impedance circuit 120, where X-axis represents the frequency of the input signal $SIG_{IN}$, Y-axis represents impedance, the solid line L110 represents the frequency response of the first impedance circuit 110, and the dotted line L120 represented the frequency response of the second impedance circuit 120. In FIG. 2, between 5 GHz and 5.5 GHz, the impedance of the first impedance circuit 110 increases with the frequency of the input signal $SIG_{IN}$ while the impedance of the second impedance circuit 120 decreases with the frequency of the input signal $SIG_{IN}$. In this case, if the average voltage of the input signal $SIG_{IN}$ remains at 2V, then when the frequency of the input signal $SIG_{IN}$ increases from 5 GHz to 5.5 GHz, the voltage of the divisional signal $SIG_{DVS}$ may decrease from 1.5V to 0.6V. Consequently, the frequency of the input signal $SIG_{IN}$ could be estimated according to the voltage of the divisional signal $SIG_{DVS}$.

In FIG. 1, the first impedance circuit 110 could include a resistor R1, a capacitor C0 and an imaginary impedance unit 112 coupled in series between the first terminal and the second terminal of the first impedance circuit 110. The imaginary impedance unit 112 could include an inductor L1 coupled in parallel with a capacitor C1. In addition, the second impedance circuit 120 could include a capacitor C2 and an inductor L2 coupled in series between the first terminal and the second terminal of the second impedance circuit 120. In this case, by properly selecting the resistor R1, the inductor L1 and L2, and the capacitors C0, C1, and C2, the first impedance circuit 110 and the second impedance circuit 120 could be designed to have the required frequency response within the testing frequency band. Also, according to the frequency response of the impedance circuits 110 and 120, the relation between the voltage of the divisional signal $SIG_{DVS}$ and the frequency of the input signal $SIG_{IN}$ would be known.

Furthermore, the first impedance circuit 110 and the second impedance circuit 120 shown in FIG. 1 are used as examples, in some other embodiments, the first impedance circuit 110 and the second impedance circuit 120 may also include other components or could be implemented with different structures.

Figure 3:
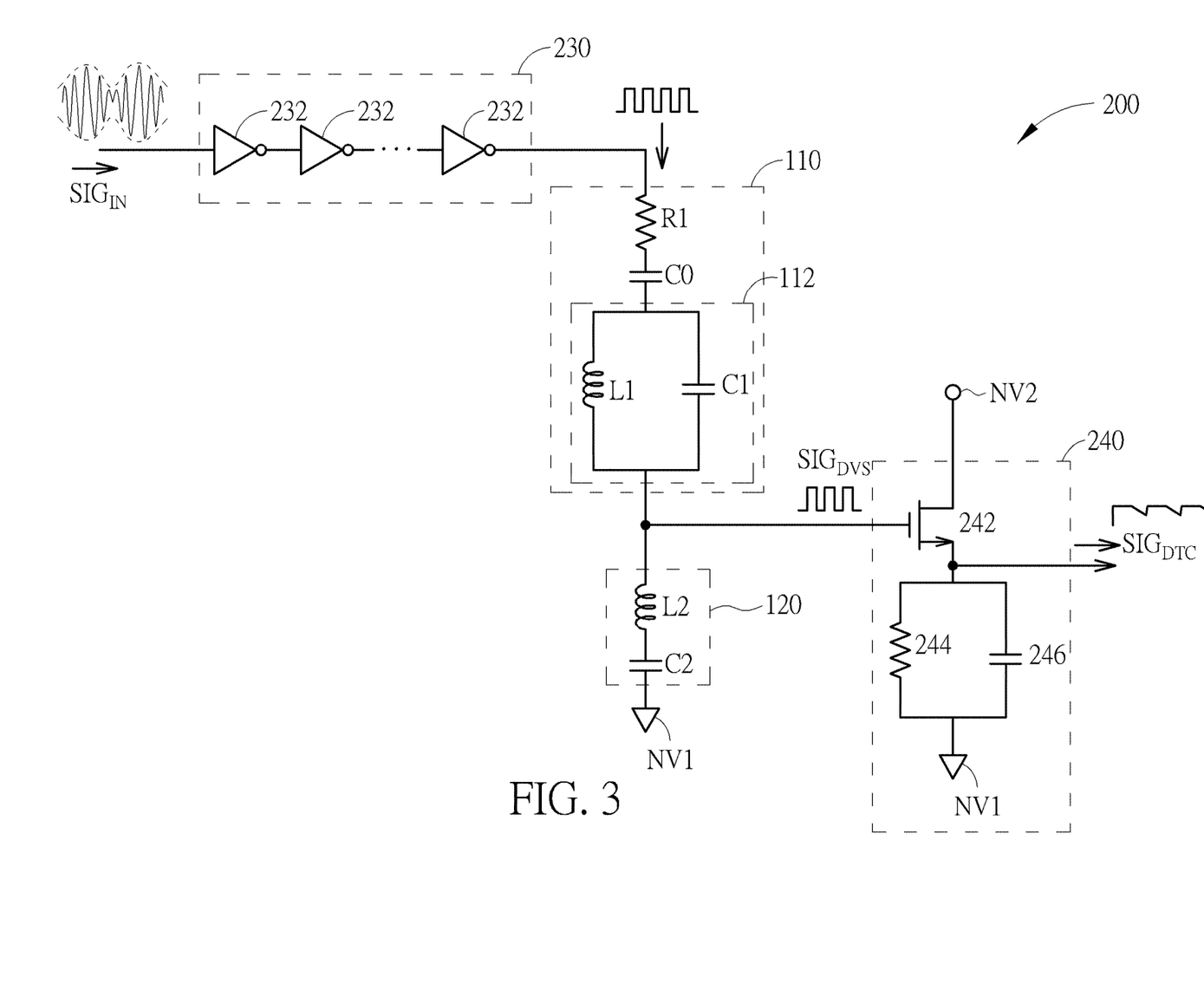
FIG. 3 shows a frequency detector according to another embodiment of the present invention.

FIG. 3 shows a frequency detector 200 according to one embodiment of the present invention. The frequency detector 200 and the frequency detector 100 have similar structures, and could be operated with similar principles. However, herein the frequency detector 200 could further include a signal adjustment circuit and a signal rectifier 240. In some embodiments, the signal adjustment circuit could be, for example, a rail to rail amplification circuit 230.

In FIG. 3, since the input signal $SIG_{IN}$ includes a carrier wave, the amplitude swing of the voltage is rather large. Therefore, if the first impedance circuit 110 and the second impedance circuit 120 receive the input signal $SIG_{IN}$ directly, the divisional signal $SIG_{DVS}$ will have greater noise. In this case, the rail to rail amplification circuit 230 could be coupled to the first terminal of the first impedance circuit 110, and the frequency detector 200 could adjust the waveform of the input signal $SIG_{IN}$ by the rail to rail amplification circuit 230 so the first terminal of the first impedance circuit 110 could receive the adjusted input signal $SIG_{IN}$. Since the adjusted input signal $SIG_{IN}$ could have a relatively regular voltage amplitude variation, the voltage change of the divisional signal $SIG_{DVS}$ could correspond to the frequency of the input signal $SIG_{IN}$ more accurately.

In addition, the frequency detector 200 could rectify the divisional signal $SIG_{DVS}$ by the signal rectifier 240 to generate the detection signal $SIG_{DTC}$ with better-regulated voltage so the following circuits could identify the frequency for other applications even more easily.

In FIG. 3, the signal rectifier 240 could be coupled to the second terminal of the first impedance circuit 110. The signal rectifier 240 could receive the divisional signal $SIG_{DVS}$, and rectify the divisional signal $SIG_{DVS}$ to output the detection signal $SIG_{DTC}$. The signal rectifier 240 could include a transistor 242, a resistor 244, and a capacitor 246. The transistor 242 has a first terminal coupled to a second system voltage terminal NV2, a second terminal, and a control terminal coupled to the second terminal of the first impedance circuit 110. In this case, the transistor 242 could be a metal-oxide-semiconductor field effective transistor, and could be used as a source follower. However, in some other embodiments, the transistor 242 could be a bipolar junction transistor, and could be used as an emitter follower.

The resistor 244 has a first terminal coupled to the second terminal of the transistor 242, and a second terminal coupled to the first system voltage terminal NV1. The capacitor 246 has a first terminal coupled to the second terminal of the transistor 242, a second terminal coupled to the first system voltage terminal NV1. With the signal rectifier 240, the divisional signal $SIG_{DVS}$ could be transformed into the detection signal $SIG_{DTC}$ having smaller voltage ripples.

Since the signal rectifier 240 will be charged only when the divisional signal $SIG_{DVS}$ is at a high voltage, the signal rectifier 240 in FIG. 3 could be seemed as a half-wave rectifier. However, in some other embodiments, a full-wave rectifier could be used to implement the signal rectifier 240 to further stabilize the voltage of the detection signal $SIG_{DTC}$. For example, the signal rectifier 240 could use a differential structure to achieve the function of full-wave rectification.

In FIG. 3, the rail to rail amplification circuit 230 could include a plurality of inverters 232 coupled in series. In this case, the input signal $SIG_{IN}$ adjusted by the rail to rail amplification circuit 230 may have a square waveform; therefore, the divisional signal $SIG_{DVS}$ will also be like a square wave. However, in some other embodiments, the frequency detector 200 could also use other circuits to adjust the waveform of the input signal $SIG_{IN}$. For example, the frequency detector 200 could also use a feedback amplifier, such as a Cherry Hooper amplifier, to implement the signal adjustment circuit for adjusting the waveform of the input signal $SIG_{IN}$.

Figure 4:
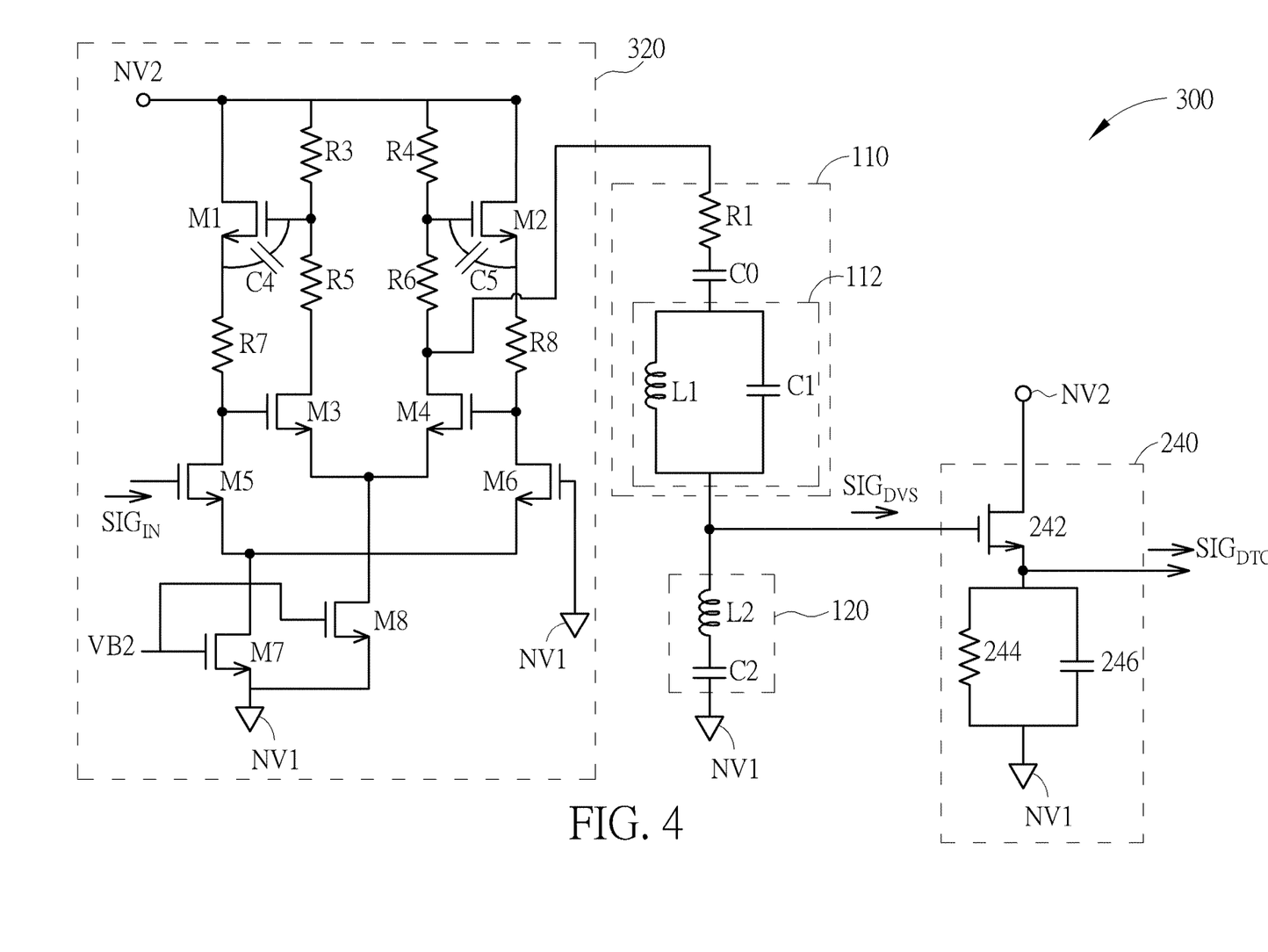
FIG. 4 shows a frequency detector according to another embodiment of the present invention.

FIG. 4 shows a frequency detector 300 according to one embodiment of the present invention. The frequency detector 300 and the frequency detector 200 have similar structures and could be operated with similar principles. However, the frequency detector 300 could include a feedback amplifier 320 to adjust the waveform of the input signal $SIG_{IN}$.

The feedback amplifier 320 includes transistors M1 to M8, resistors R3 to R8, and capacitors C4 and C5. The resistor R3 has a first terminal coupled to the second system voltage terminal NV2, and a second terminal. The transistor M1 has a first terminal coupled to the first terminal of the resistor R3, a second terminal, and a control terminal coupled to the second terminal of the resistor R3. The resistor R7 has a first terminal coupled to the second terminal of the transistor M1, and a second terminal. The resistor R5 has a first terminal coupled to the control terminal of the transistor M1, and a second terminal. The transistor M3 has a first terminal coupled to the second terminal of the resistor R5, a second terminal, and a control terminal coupled to the second terminal of the resistor R7. The transistor M5 has a first terminal coupled to the second terminal of the resistor R7, a second terminal, and a control terminal for receiving the input signal $SIG_{IN}$. The transistor M7 has a first terminal coupled to the second terminal of the transistor M5, a second terminal coupled to the first system voltage terminal NV1, and a control terminal for receiving a bias voltage VB2. The transistor M8 has a first terminal coupled to the second terminal of the transistor M3, a second terminal coupled to the first system voltage terminal NV1, and a control terminal for receiving the bias voltage VB2.

The resistor R4 has a first terminal coupled to the second system voltage terminal NV2, and a second terminal. The transistor M2 has a first terminal coupled to the first terminal of the resistor R4, a second terminal, and a control terminal coupled to the second terminal of the resistor R4. The resistor R8 has a first terminal coupled to the second terminal of the transistor M2, and a second terminal. The resistor R6 has a first terminal coupled to the control terminal of the transistor M2, and a second terminal coupled to the first terminal of the first impedance circuit 110. The transistor M4 has a first terminal coupled to the second terminal of the resistor R6, a second terminal coupled to the second terminal of the transistor M3, and a control terminal coupled to the second terminal of the resistor R8. The transistor M6 has a first terminal coupled to the second terminal of the resistor R8, a second terminal coupled to the second terminal of the transistor M5, and a control terminal coupled to the first system voltage terminal NV1. In addition, the capacitor C4 could be coupled between the control terminal and the second terminal of the transistor M1, and the capacitor C5 could be coupled between the control terminal and the second terminal of the transistor M2.

Figure 5:
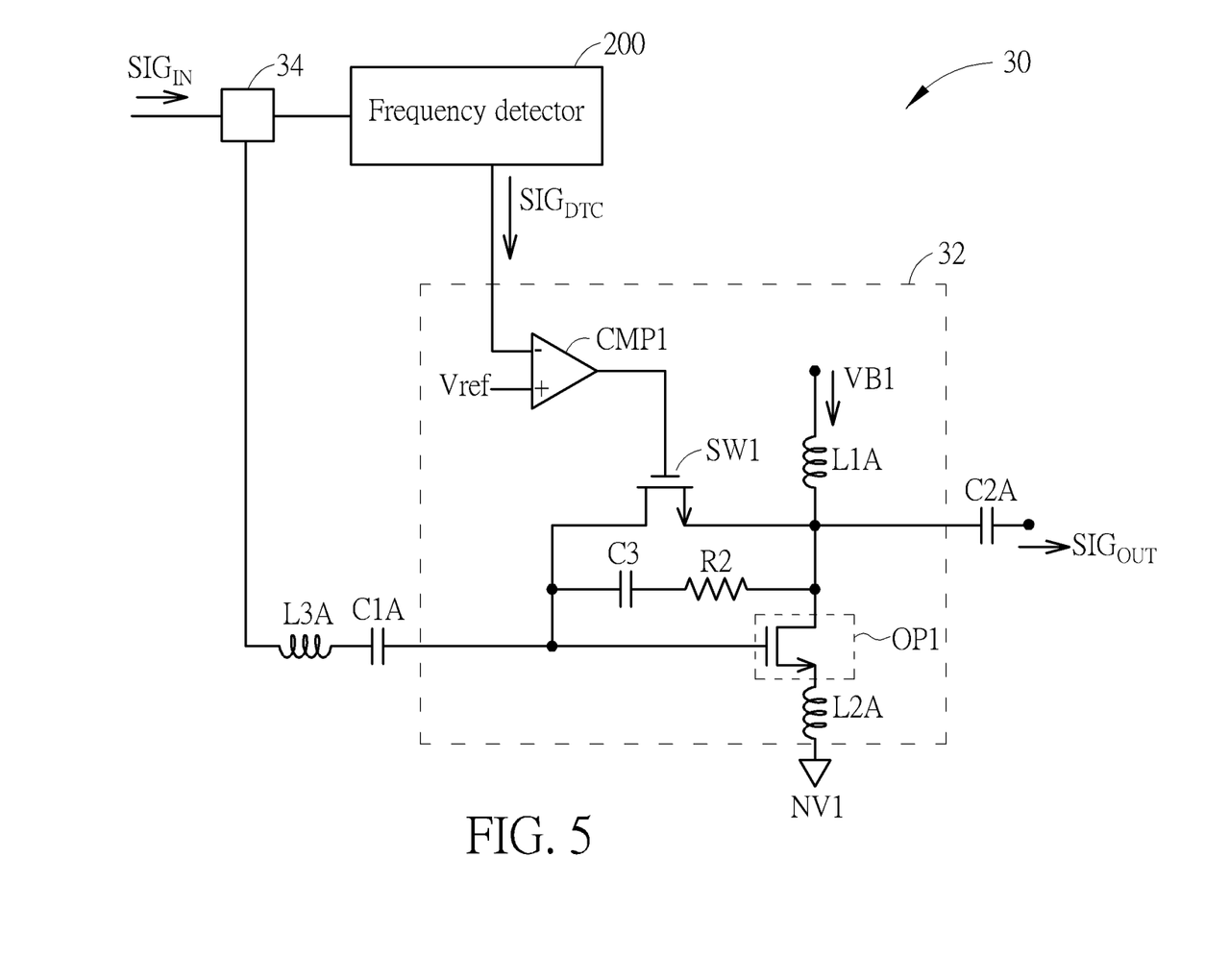
FIG. 5 shows a radio frequency circuit according to one embodiment of the present invention.

FIG. 5 shows a radio frequency circuit 30 according to one embodiment of the present invention. The radio frequency circuit 30 includes the frequency detector 200 and a signal processing unit 32. In FIG. 5, the radio frequency circuit 30 could use the frequency detector 200 to detect the frequency of the input signal $SIG_{IN}$; however, in some other embodiments, the radio frequency circuit 30 could also use the frequency detector 100 or 300 to detect the frequency of the input signal $SIG_{IN}$.

In addition, the radio frequency circuit 30 could process the input signal $SIG_{IN}$ by the signal processing unit 32, and could adjust the frequency response of the signal processing unit 32 according to the detection signal $SIG_{DTC}$. For example, the signal processing unit 32 could include an amplifier OP1, and the amplifier OP1 could be used to amplify the input signal $SIG_{IN}$. However, in general, the amplifier OP1 may have different linearity performance in different bands; therefore, when the frequency of the input signal $SIG_{IN}$ switches between different bands, the amplified signal outputted by the amplifier OP1 may be distorted. In this case, the signal processing unit 32 could adjust the matching impedance of the amplifier OP1 according to the detection signal $SIG_{DTC}$.

For example, the signal processing unit 32 could compare the detection signal $SIG_{DTC}$ with a predetermined reference voltage Vref by a comparator CMP1. When the voltage of the detection signal $SIG_{DT}C$ is greater than the reference voltage Vref, it may imply that the input signal $SIG_{IN}$ is in a lower frequency band. In this case, the comparator CMP1 could output a low voltage signal to turn off the switch SW1; therefore, part of the input signal $SIG_{IN}$ will flow through the path formed by the capacitor C3 and the resistor R2. In contrast, when the voltage of the detection signal $SIG_{DTC}$ is smaller than the reference voltage Vref, it may imply that the input signal $SIG_{IN}$ is in a higher frequency band. In this case, the comparator CMP1 could output a high voltage signal to turn on the switch SW1 so most of the input signal $SIG_{IN}$ will flow through the path formed by the turned-on switch SW1 instead of the path formed by the capacitor C3 and the resistor R2. Consequently, the input impedance of the amplifier OP1 could be decreased when the input signal $SIG_{IN}$ is in a higher frequency band, thereby maintaining the linearity of the amplifier OP1.

That is, the radio frequency circuit 30 could adjust the matching impedance of the signal processing unit 32 according to the frequency of the input signal $SIG_{IN}$. Therefore, when the frequency of the input signal $SIG_{IN}$ changes, the amplifier OP1 of the signal processing unit 32 could maintain a linear performance.

In some embodiments, the amplifier OP1 could further include more switches for adjusting the impedance, and the radio frequency circuit 30 could use the comparator CMP1 for controlling the switches to adjust the matching impedance according to the frequency of the input signal $SIG_{IN}$. Furthermore, in some embodiments, the radio frequency circuit 30 could include a plurality of comparators, and the detection signal $SIG_{DTC}$ could be compared with a plurality of reference voltages, to determine the frequency bands to which the input signal $SIG_{IN}$ belongs more accurately, so the radio frequency circuit 30 could adjust the impedance of the amplifier OP1 by controlling the switches according to the frequency band of the input signal $SIG_{IN}$.

Furthermore, in some embodiments, the radio frequency circuit 30 could adopt the coupling component 34 for receiving the input signal $SIG_{IN}$ and distributing the input signal $SIG_{IN}$ to the frequency detector 200 and to the signal processing unit 32 so as to prevent the frequency detector 200 from disturbing the input signal $SIG_{IN}$ to be processed by the signal processing unit 32 during the frequency detection. For example, the coupling component 34 could be a coupler.

In FIG. 5, to block the low frequency noise, the inductor L3A and the capacitor C1A could be disposed on the path that the signal processing unit 32 receives the input signal $SIG_{IN}$. In addition, to reduce the high frequency noise, the amplifier OP1 could be coupled to the bias voltage VB1 and the first system voltage terminal NV1 through the inductors L1A and L2A. Furthermore, the amplifier OP1 could output the signal $SIG_{OUT}$ through the capacitor C2A for blocking the direct current signal.

Figure 6:
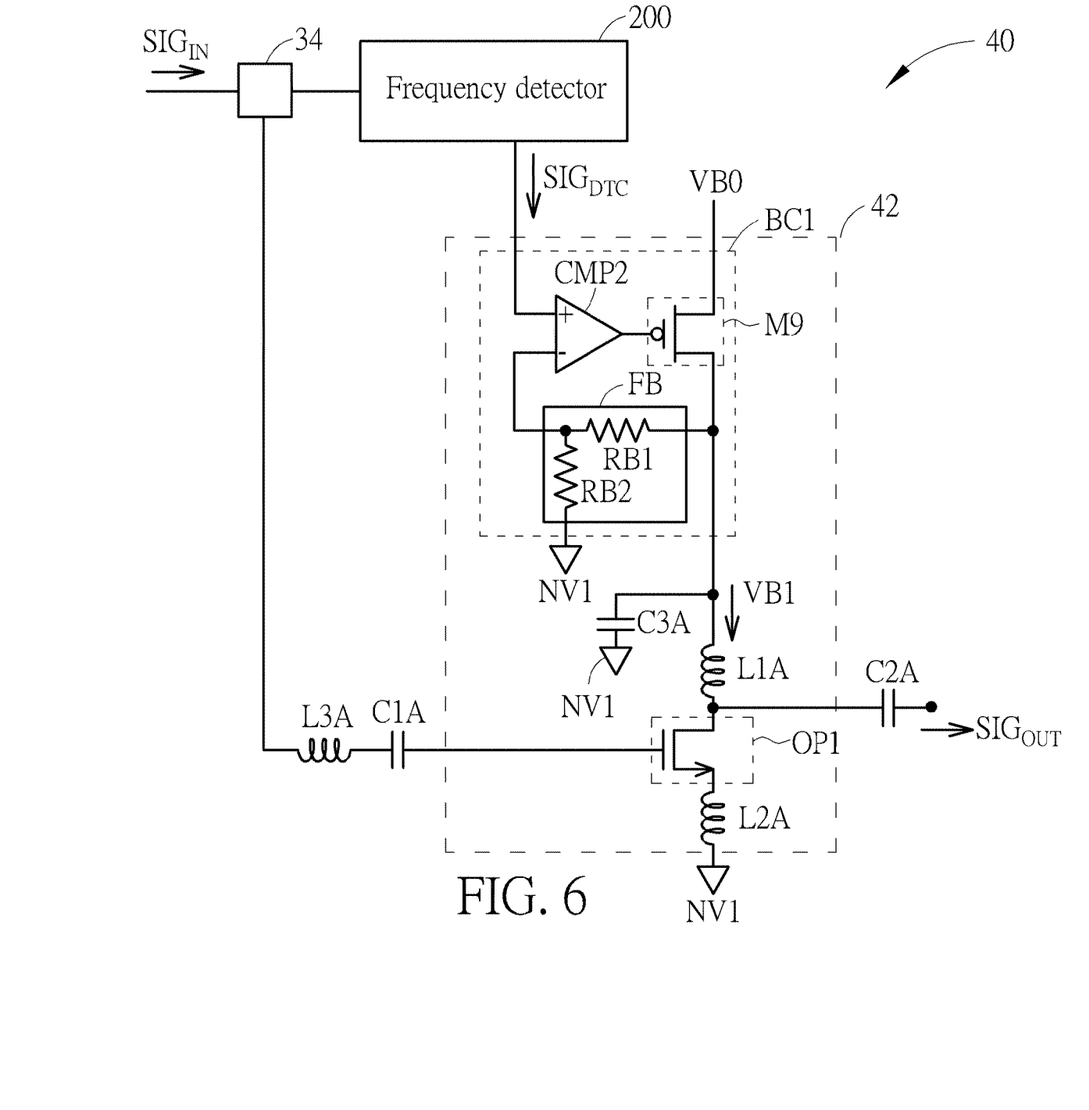
FIG. 6 shows a radiofrequency circuit according to another embodiment of the present invention.

In addition, in some embodiments, the signal processing unit 32 could also adjust the bias voltage VB1 received by the amplifier OP1 according to the detection signal $SIG_{DTC}$, so the performance of linearity of the amplifier OP1 could be maintained when processing signals in different frequency bands. FIG. 6 shows a radio frequency circuit 40 according to one embodiment of the present invention. The radio frequency circuit 40 could include the frequency detector 200 and a signal processing unit 42. In FIG. 6, the signal processing unit 42 could include the bias circuit BC1 and the amplifier OP1. The bias circuit BC1 could include an amplifier CMP2, a transistor M9, and a feedback unit FB. A first input terminal of the amplifier CMP2 could be coupled to the feedback unit FB, a second input terminal of the amplifier CMP2 could receive the detection signal $SIG_{DTC}$, and the output terminal of the amplifier CMP2 could be coupled to the control terminal of the transistor M9.

The transistor M9 has a first terminal for receiving the bias voltage VB0, a second terminal for outputting the bias voltage VB1 and coupled to the feedback unit FB, and a control terminal. In FIG. 6, the feedback unit FB could be, for example, implemented by resistors RB1 and RB2. For example, the resistor RB1 has a first terminal coupled to the second terminal of the transistor M9, and a second terminal coupled to the first input terminal of the amplifier CMP2. The resistor RB2 has a first terminal coupled to the first input terminal of the amplifier CMP2, and a second terminal coupled to the first system voltage terminal NV1. In addition, in FIG. 6, the signal processing unit 42 could further include a capacitor C3A for reducing the high frequency noise in the bias voltage VB1. The capacitor C3A could have a first terminal coupled to the second terminal of the transistor M9 in the bias circuit BC1, and a second terminal coupled to the first system voltage terminal NV1.

That is, the signal processing unit 42 could adjust the bias voltage VB1 received by the amplifier OP1 according to the detection signal $SIG_{DTC}$. In some embodiments, the radio frequency circuit 40 could also include the comparator CMP1 in the radio frequency circuit 30, and could adjust the matching impedance of the amplifier OP1. That is, in some embodiments, the radio frequency circuit 40 could adjust both the matching impedance of the amplifier OP1 and the bias voltage VB1 received by the amplifier OP1 according to the detection signal $SIG_{DTC}$.

Figure 7:
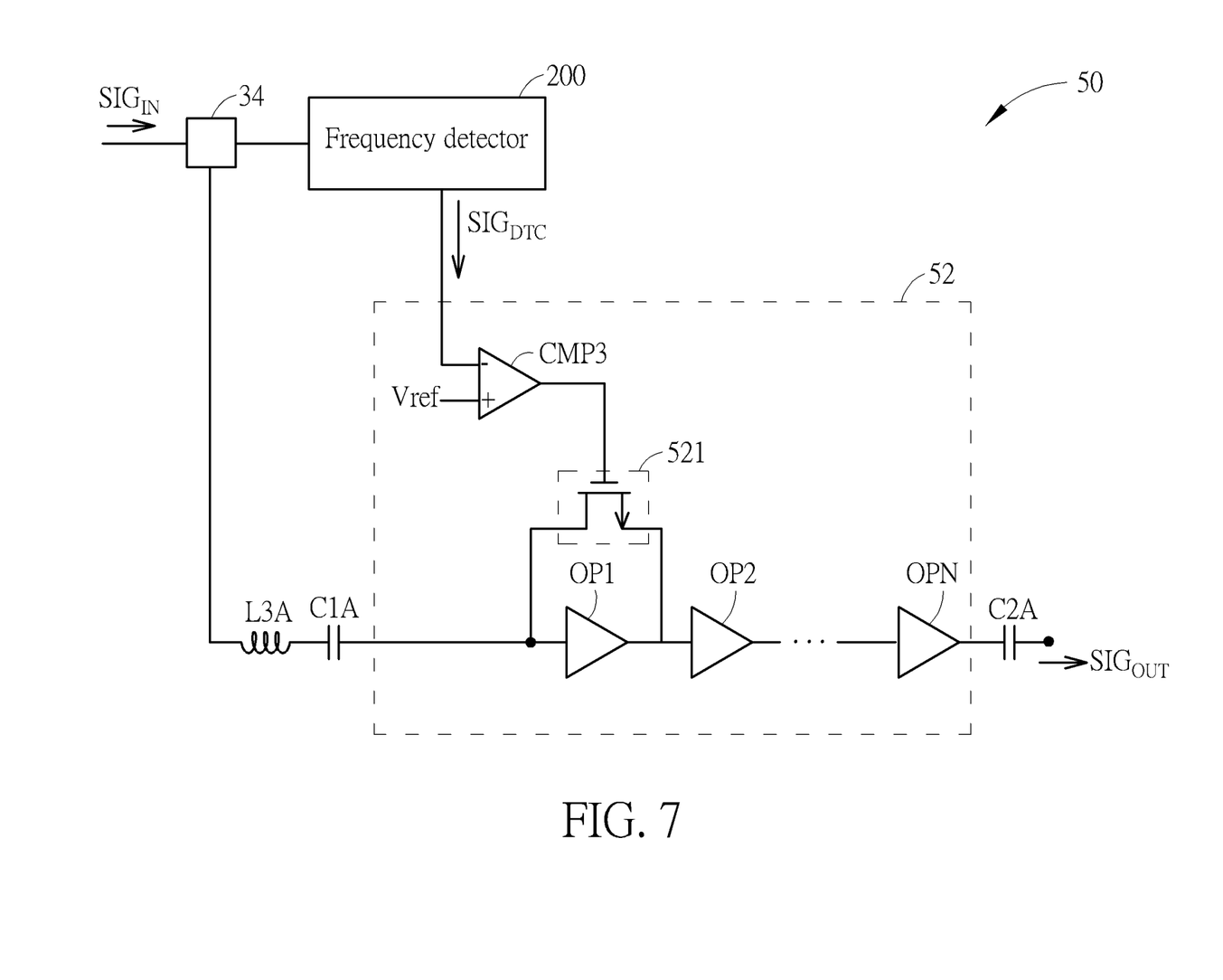
FIG. 7 shows a radio frequency circuit according to another embodiment of the present invention.

FIG. 7 shows a radio frequency circuit 50 according to one embodiment of the present invention. The radio frequency circuit 50 includes the frequency detector 200 and a signal processing unit 52. In FIG. 7, the signal processing unit 52 could include a plurality of amplifiers OP1 to OPN, where N is a positive integer. The signal processing unit 52 could activate a correspondent number of amplifiers according to the detection signal $SIG_{DTC}$.

For example, when the signal processing unit 52 determines that the input signal $SIG_{IN}$ is in a rather high frequency band according to the detection signal $SIG_{DTC}$, for example, when the voltage of the detection signal $SIG_{DTC}$ is greater than the reference voltage Vref, the comparator CMP3 could output a low voltage and the bypass circuit 521 will be turned off. Therefore, the input signal $SIG_{IN}$ could be amplified by the N amplifiers OP1 to OPN to output the output signal $SIG_{OUT}$. In contrast, when the signal processing unit 52 determines that the input signal $SIG_{IN}$ is in a rather low frequency, the comparator CMP3 could output a high voltage and the bypass circuit 521 will be turned on. Therefore, the amplifier OP1 will be bypassed by the bypass circuit 521, and the input signal $SIG_{IN}$ will be inputted to the amplifier OP2, and will be amplified by the amplifiers OP2 to OPN so as to reduce the gain of the signal processing unit 52. Consequently, the gain of the signal processing unit 52 for amplifying the input signal $SIG_{IN}$ could be adjusted according to the frequency band of the input signal $SIG_{IN}$, thereby improving the efficiency of the radio frequency circuit 50.

In summary, the frequency detectors and the radio frequency circuits provided by the embodiments of the present invention could detect the frequency of the input signal by impedance circuits having different frequency responses, and the frequency response of the signal processing unit in the radio frequency circuit could be adjusted according to the frequency of the input signal, for example but not limited to, by adjusting the matching impedance and the amplification gain. Therefore, when the radio frequency circuit receives input signals of different frequencies, the performance of linearity could be maintained so as to improve the communication quality.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency detector comprising:
a first impedance circuit having a first terminal configured to receive an input signal, and a second terminal configured to output a divisional signal, and comprising a resistor, a capacitor, and an imaginary impedance unit coupled in series between the first terminal and the second terminal of the first impedance circuit; and
a second impedance circuit having a first terminal coupled to the second terminal of the first impedance circuit, and a second terminal coupled to a first system voltage terminal;
wherein:
a frequency response of the first impedance circuit is different from a frequency response of the second impedance circuit; and
a resistance of the first impedance circuit, a resistance of the second impedance circuit, and the divisional signal change with a frequency of the input signal.

2. The frequency detector of claim 1, wherein within a testing frequency band, a change of impedance with respect to frequency of the first impedance circuit and a change of impedance with respect to frequency of the second impedance circuit have opposite tendencies.

3. The frequency detector of claim 1, wherein the imaginary impedance unit comprises a first inductor and a first capacitor coupled in parallel.

4. The frequency detector of claim 1, wherein the second impedance circuit comprises a second capacitor and a second inductor coupled in series between the first terminal and the second terminal of the second impedance circuit.

5. The frequency detector of claim 1, further comprising:
a signal adjustment circuit coupled to the first terminal of the first impedance circuit, and configured to adjust a waveform of the input signal so that a voltage variation of the input signal becomes more regulated after being adjusted, wherein the first terminal of the first impedance circuit receives the adjusted input signal.

6. The frequency detector of claim 5, wherein the signal adjustment circuit comprises:
a rail to rail amplification circuit coupled to the first terminal of the first impedance circuit, and configured to adjust the waveform of the input signal and have the first terminal of the first impedance circuit receive the adjusted input signal; or
a feedback amplifier coupled to the first terminal of the first impedance circuit, and configured to adjust the waveform of the input signal and have the first terminal of the first impedance circuit receive the adjusted input signal.

7. A frequency detector comprising:
a first impedance circuit having a first terminal configured to receive an input signal, and a second terminal configured to output a divisional signal;
a second impedance circuit having a first terminal coupled to the second terminal of the first impedance circuit, and a second terminal coupled to a first system voltage terminal; and a signal rectifier coupled to the second terminal of the first impedance circuit, and configured to receive the divisional signal and generate a detection signal by rectifying the divisional signal;

wherein:

a frequency response of the first impedance circuit is different from a frequency response of the second impedance circuit; and a resistance of the first impedance circuit, a resistance of the second impedance circuit, and the divisional signal change with a frequency of the input signal.

8. The frequency detector of claim 7, wherein the signal rectifier comprises:

a transistor having a first terminal coupled to a second system voltage terminal, a second terminal, and a control terminal coupled to the second terminal of the first impedance circuit;

a resistor having a first terminal coupled to the second terminal of the transistor, and a second terminal coupled to the first system voltage terminal; and a capacitor having a first terminal coupled to the second terminal of the transistor, and a second terminal coupled to the first system voltage terminal.

9. The frequency detector of claim 7, wherein the signal rectifier is a half-wave rectifier or a full-wave rectifier.

10. A radio frequency circuit comprising:

a frequency detector comprising:

a first impedance circuit having a first terminal configured to receive an input signal, and a second terminal configured to output a divisional signal, wherein the frequency detector outputs a detection signal according to the divisional signal; and a second impedance circuit having a first terminal coupled to the second terminal of the first impedance circuit, and a second terminal coupled to a first system voltage terminal; and a signal processing unit configured to process the input signal, and adjust a frequency response of the signal processing unit according to the detection signal;

wherein:

a frequency response of the first impedance circuit is different from a frequency response of the second impedance circuit;

a resistance of the first impedance circuit, a resistance of the second impedance circuit, and the divisional signal change with a frequency of the input signal; and the signal processing unit comprises:

an amplifier, the signal processing unit being configured to adjust a matching impedance of the amplifier according to the detection signal; or a plurality of amplifiers, the signal processing unit being configured to activate a corresponding number of amplifiers of the plurality of amplifiers to adjust a gain of the signal processing unit for amplifying the input signal according to the detection signal; or an amplifier, the signal processing unit being configured to adjust a bias voltage applied to the amplifier according to the detection signal.

11. The radio frequency circuit of claim 10, wherein within a testing frequency band, a change of impedance with respect to frequency of the first impedance circuit and a change of impedance with respect to frequency of the second impedance circuit have opposite tendencies.

12. The radio frequency circuit of claim 10, wherein the first impedance circuit comprises a resistor, a capacitor, and an imaginary impedance unit coupled in series between the first terminal and the second terminal of the first impedance circuit.

13. The radio frequency circuit of claim 12, wherein the imaginary impedance unit comprises a first inductor and a first capacitor coupled in parallel.

14. The radio frequency circuit of claim 10, wherein the second impedance circuit comprises a second capacitor and a second inductor coupled in series between the first terminal and the second terminal of the second impedance circuit.

15. The radio frequency circuit of claim 10, wherein the frequency detector further comprising:

a signal adjustment circuit coupled to the first terminal of the first impedance circuit, and configured to adjust a waveform of the input signal so that a voltage variation of the input signal becomes more regulated after being adjusted, wherein the first terminal of the first impedance circuit receives the adjusted input signal.

16. The radio frequency circuit of claim 10, wherein the frequency detector further comprising a signal rectifier coupled to the second terminal of the first impedance circuit, and configured to receive the divisional signal and generate the detection signal by rectifying the divisional signal.

17. The radio frequency circuit of claim 16, wherein the signal rectifier comprises:

a transistor having a first terminal coupled to a second system voltage terminal, a second terminal, and a control terminal coupled to the second terminal of the first impedance circuit;

a resistor having a first terminal coupled to the second terminal of the transistor, and a second terminal coupled to the first system voltage terminal; and a capacitor having a first terminal coupled to the second terminal of the transistor, and a second terminal coupled to the first system voltage terminal.

* * * * *